US006897082B2

(12) United States Patent
Rhodes et al.

(10) Patent No.: US 6,897,082 B2
(45) Date of Patent: May 24, 2005

(54) METHOD OF FORMING WELL FOR CMOS IMAGER

(75) Inventors: Howard E. Rhodes, Boise, ID (US); Inna Patrick, Boise, ID (US); Richard A. Mauritzson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/648,378

(22) Filed: Aug. 27, 2003

(65) Prior Publication Data
US 2004/0253761 A1 Dec. 16, 2004

Related U.S. Application Data
(60) Provisional application No. 60/478,350, filed on Jun. 16, 2003.

(51) Int. Cl.[7] ............................................. H01L 21/00
(52) U.S. Cl. ......................................... 438/48; 438/224
(58) Field of Search .......................... 438/48, 60, 69, 438/217, 224, 370

(56) References Cited
U.S. PATENT DOCUMENTS

| | | | | |
|---|---|---|---|---|
| 5,877,049 A | * | 3/1999 | Liu et al. | 438/224 |
| 6,326,219 B2 | * | 12/2001 | Markle et al. | 438/14 |
| 6,768,149 B1 | * | 7/2004 | Mann et al. | 257/292 |
| 6,794,281 B2 | * | 9/2004 | Madhukar et al. | 438/592 |

* cited by examiner

Primary Examiner—Phuc T. Dang
(74) Attorney, Agent, or Firm—Dickstein Shapiro Morin & Oshinsky LLP

(57) ABSTRACT

A well region of a first conductivity type located in a substrate of the first conductivity type and below about half the channel length of an electrically active portion of a transistor gate is disclosed. The well region is laterally displaced from a charge collection region of a second conductivity type of a pinned photodiode.

27 Claims, 8 Drawing Sheets

METHOD OF FORMING WELL FOR CMOS IMAGER

CROSS REFERENCE TO OTHER APPLICATIONS

This application claims priority to U.S. Provisional Patent Application No. 60/478,350 filed on Jun. 16, 2003 which is hereby incorporated by reference in its entirety.

FIELD OF THE INVENTION

The present invention relates to the field of semiconductor devices and, in particular, to improved high quantum efficiency imagers.

BACKGROUND OF THE INVENTION

CMOS imagers are increasingly being used as low cost imaging devices. A CMOS image sensor circuit includes a focal plane array of pixel cells, each one of the cells including a photogate, photoconductor, or photodiode overlying a charge accumulation region within a substrate for accumulating photo-generated charge. Each pixel cell may include a transistor for transferring charge from the charge accumulation region to a sensing node, and a transistor for resetting a sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node. Photo-generated charge may be amplified when it moves from the initial charge accumulation region to the sensing node. The charge at the sensing node is typically converted to a pixel output voltage by a source follower output transistor.

A schematic top view of a portion of a semiconductor wafer fragment containing one exemplary CMOS pixel cell is shown in FIG. 1. The CMOS pixel cell 10 is a four transistor (4T) cell. The CMOS pixel cell 10 generally comprises a charge collection region 21 for collecting charges generated by light incident on the pixel, and a transfer gate 50 for transferring photoelectric charges from the collection region 21 to a sensing node, typically a floating diffusion region 25. The floating diffusion region 25 is electrically connected to the gate of an output source follower transistor 60. The pixel cell 10 also includes a reset transistor 40 for resetting the floating diffusion region 25 to a predetermined voltage before sensing a signal; a source follower transistor 60 which receives at its gate an electrical signal from the floating diffusion region 25; and a row select transistor 80 for outputting a signal from the source follower transistor 60 to an output terminal in response to an address signal.

FIG. 2 is a diagrammatic side sectional view of the pixel cell 10 of FIG. 1 taken along line A–A'. As shown in FIG. 2, the exemplary CMOS pixel cell 10 has a pinned photodiode (PPD) as the charge collection region 21. The PPD 21 is termed such since the potential in the photodiode is pinned to a constant value when the photodiode is fully depleted.

The PPD 21 is adjacent to the gate 50 of a transfer transistor. The PPD 21 has a photosensitive or p-n-p junction region comprising a p-type surface layer 24 and an n-type photodiode region 26 within a p-type active layer 20.

Generally, in CMOS image sensors such as the CMOS image sensor cell 10 of FIGS. 1–2, incident light causes electrons to collect in region 26. A maximum output signal, which is produced by the source follower transistor having gate 60, is proportional to the number of electrons to be extracted from the region 26. The maximum output signal increases with increased electron capacitance or acceptability of the region 26 to acquire electrons. The electron capacity of pinned photodiodes typically depends, among other factors, on the doping level of the image sensor and the dopants implanted into the active layer.

Typically, the p-type layer 24, the n-type region 26 and the floating diffusion region 25 are formed within a doped well, for example a p-type well for NMOS transistors or an n-type well for PMOS transistors, located within substrate 20. This well is typically formed prior to the formation of the transfer gate 50 by implanting dopants of a predefined conductivity type within the substrate 20. As known in the art, both the location and dopant concentration of the well affect critical parameters of CMOS imagers, such as dark current, lag and quantum efficiency. For example, if the p-type layer 24, the n-type region 26 and the floating diffusion region 25 are all formed within the doped well, then the quantum efficiency of the imager decreases. If, however, the doped well is masked only in the photodiode region so that the doped well extends below the transfer gate 50 and the floating diffusion region 25, then the quantum efficiency is not affected, but the barrier to charge transfer between the photodiode and the transfer gate is undesirably increased. Alternatively, if the doped well is masked totally out of both the transfer gate and the photodiode region, then the transfer gate leakage undesirably increases.

Accordingly, there is needed an improved active pixel photosensor for use in a CMOS imager that exhibits increased barrier control, improved quantum efficiency and improved leakage. A method of fabricating an active pixel photosensor exhibiting these improvements is also needed, as well as a method of forming a doped well with optimized barrier control.

BRIEF SUMMARY OF THE INVENTION

In one aspect, the invention provides a well region of a first conductivity type located below at least a portion of an electrically active region of a transistor gate and laterally displaced from a charge collection region of a second conductivity type of a pinned photodiode. Preferably, the well region of the first conductivity type is located below about half of the electrically active portion of the transistor gate.

In another aspect, the invention provides a well region of a first conductivity type which is located within a substrate of the first conductivity type, but which is totally masked from a photodiode region of a pixel sensor cell. Preferably, the well region of the first conductivity type is located below about half the length of the electrically active portion of a transistor gate and laterally displaced from a charge collection region of a second conductivity type of the photodiode.

In another aspect, the invention provides a method of providing an improved charge transfer between a photodiode and a transistor gate, such as a transfer gate of a pixel sensor cell. A transistor gate is formed over a substrate of a first conductivity type. A well region of the first conductivity type is formed below at least a portion of an electrically active region of the transistor gate and, preferably, subsequent to the formation of the transistor gate. In one embodiment, the well region is formed by implanting a dopant of the first conductivity type in an area of a substrate below about half the channel length of the electrically active portion of the transistor gate to form a doped region of a first dopant concentration. The doped region is also laterally displaced from a charge collection region of a second conductivity type of a pinned photodiode, and having a second dopant concentration.

In another embodiment, a transistor gate, for example a transfer gate of a 4T pixel cell, is formed over a substrate of a first conductivity type. A mask is directly aligned with the transistor gate and patterned so that about half the length of the transistor gate and an active area where a photodiode is to be formed are masked. Ion implantation is next conducted to implant dopants of the first conductivity type below about half the length of the transistor gate and below an isolation region adjacent the active area, but not under the active area of the substrate where the photodiode is to be formed, forming a doped well region of the first conductivity type. A charge collection region of a second conductivity type of a photodiode is formed laterally displaced from the well region of the first conductivity type.

By providing a lateral impurity gradient and a corresponding potential gradient that favors photogenerated electron movement from the charge collection region of the photodiode, under the transistor gate, and to a floating diffusion node, potential barriers are less likely to form and more complete charge transfer and lower voltage operation are facilitated.

These and other features of the invention will be more apparent from the following detailed description that is provided in connection with the accompanying drawings and illustrated exemplary embodiments of the invention.

DETAILED DESCRIPTION OF THE INVENTION

Figure 1:
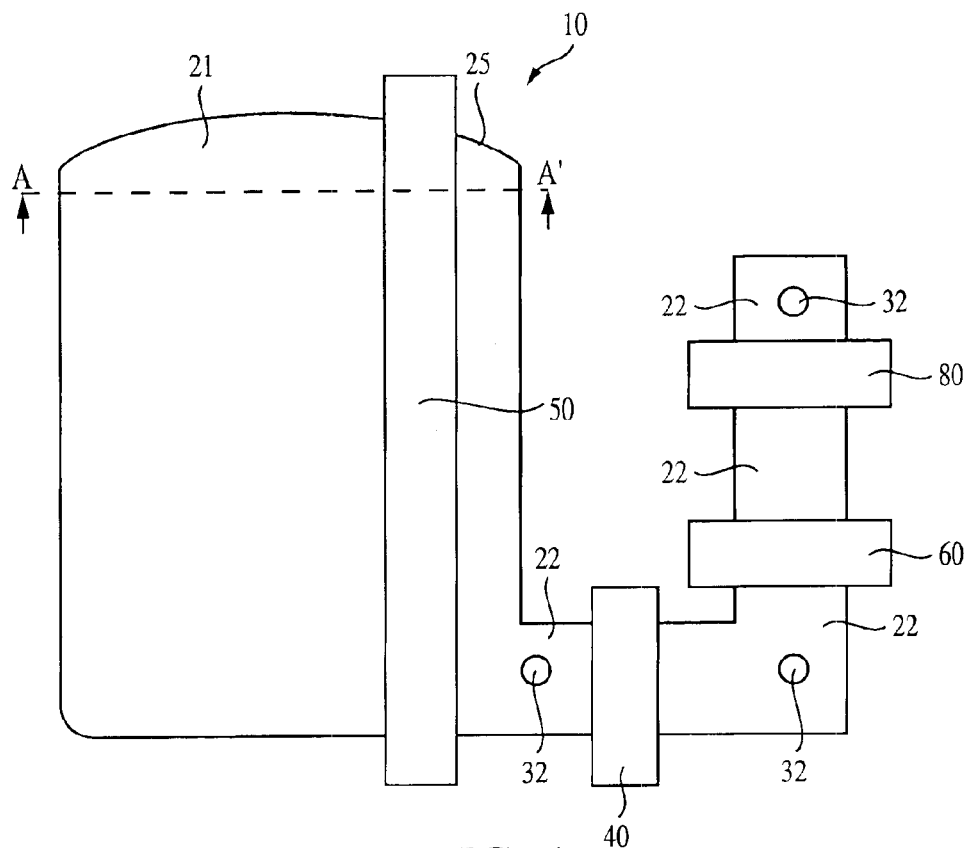
FIG. 1 is a top plan view of an exemplary CMOS image sensor pixel.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

Referring now to the drawings, where like elements are designated by like reference numerals, FIGS. 3–11 illustrate a first exemplary embodiment of a method of forming a four-transistor (4T) pixel sensor cell 100 (FIG. 11) having a pinned photodiode 199 (FIG. 11) laterally displaced from a p-type well 120 formed below about half the length of gate stack 130.

Figure 2:
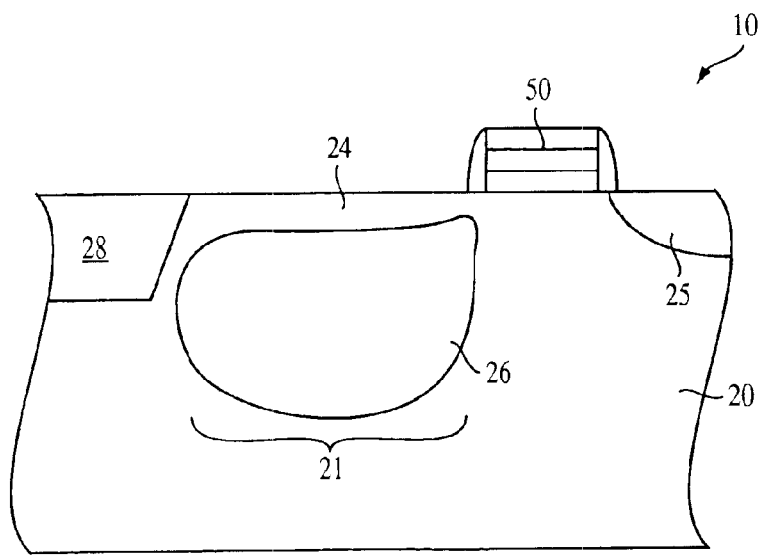
FIG. 2 is a schematic cross-sectional view of the CMOS image sensor pixel of FIG. 1 taken along line 2–2'.
Figure 3:
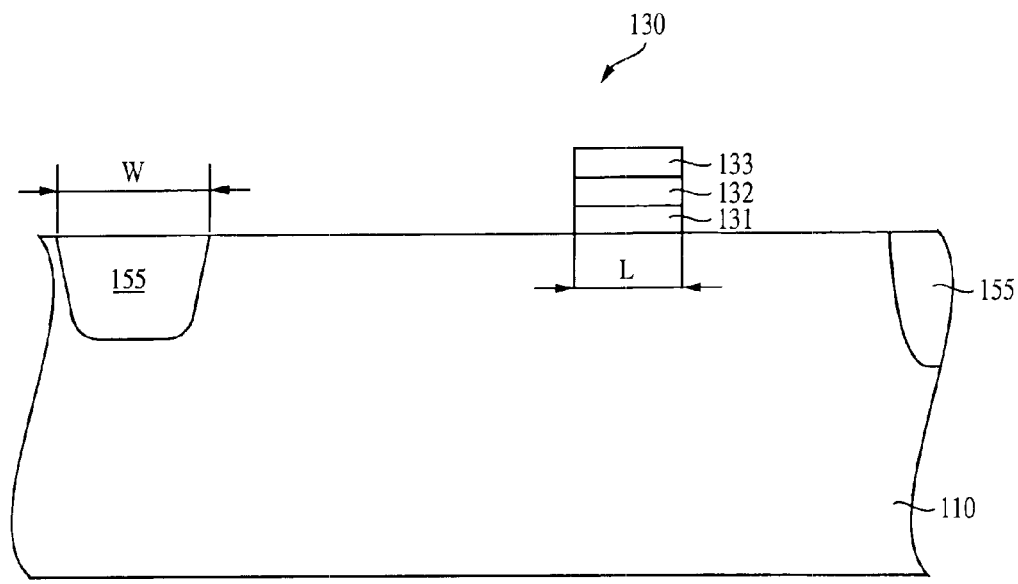
FIG. 3 is a schematic cross-sectional view of a CMOS image sensor pixel illustrating the fabrication of a doped well in accordance with an embodiment of the present invention and at an initial stage of processing.

FIG. 3 illustrates a substrate 110 along a cross-sectional view which is the same view as in FIG. 2. For exemplary purposes, the substrate 110 is a silicon substrate lightly doped with a dopant of a first conductivity type, which for exemplary purposes is p-type. However, as noted above, the invention has equal application to other semiconductor substrates and to complementary structures. The dopant concentration in the p-type silicon substrate 110 is within the range of about $1\times10^{14}$ to about $1\times10^{16}$ atoms per $cm^3$, and is preferably within the range of about $5×10^{14}$ to about $3×10^{15}$ atoms per $cm^3$.

FIG. 3 also illustrates isolation regions 155 which define a portion of a pixel. Isolation regions 155 are preferably shallow trench isolation (STI) regions, having a depth of about 1,000 to about 4,000 Angstroms, more preferably of about 2,000 to about 3,500 Angstroms, and a width "W" of about 500 to about 10,000 Angstroms, more preferably of about 1,000 to about 8,000 Angstroms. Preferably, isolation regions 155 are formed as trenches which contain a blanket-deposited dielectric material, which may be an oxide material, for example a silicon oxide such as SiO or $SiO_2$, oxynitride, a nitride material such as silicon nitride, silicon carbide, or other suitable dielectric materials. In a preferred embodiment, the dielectric material is a high density plasma (HDP) oxide, a material which has a high ability to effectively fill narrow trenches.

Also illustrated in FIG. 3 is a multi-layered transfer gate stack 130 formed over the substrate 110. The transfer gate stack 130 comprises a first gate oxide layer 131 of grown or deposited silicon oxide on the substrate 110, a conductive layer 132 of doped polysilicon or other conductive material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide), or other insulating materials. The first and second insulating layers 131, 133 and the conductive layer 132 may be formed by conventional deposition methods, for example, chemical vapor deposition (CVD) or plasma enhanced chemical vapor deposition (PECVD), among many others. The transfer gate stack 130 has a channel length "L" of about 500 Angstroms to about 10,000 Angstroms, more preferably of about 2,000 to about 8,000 Angstroms.

If desired, a silicide layer (not shown) may be also formed in the multi-layered gate stack 130, between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or $WN_X$/W or it could be entirely formed of $WN_X$.

Figure 4:
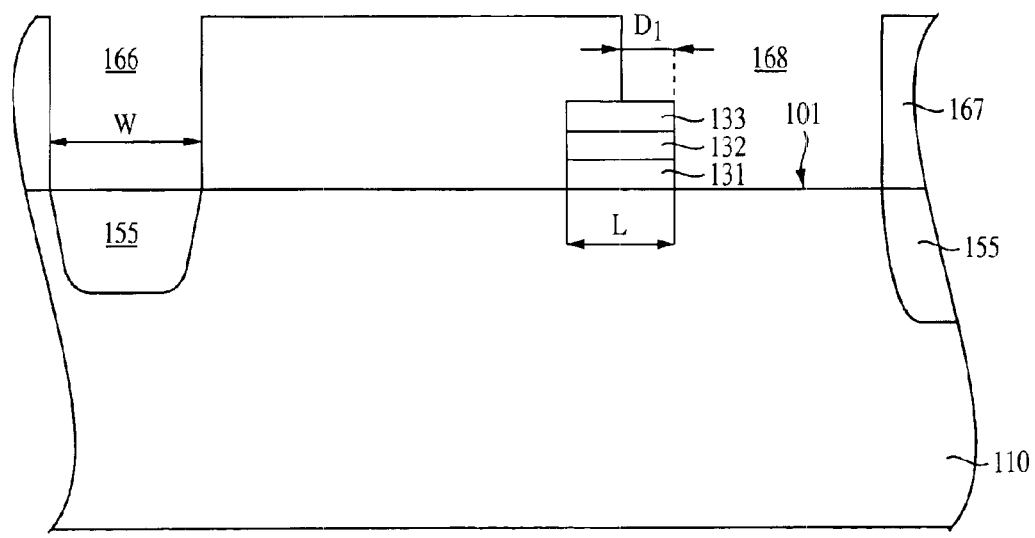
FIG. 4 is a schematic cross-sectional view of a CMOS image sensor fragment of FIG. 3 at a stage of processing subsequent to that shown in FIG. 3.
Figure 5:
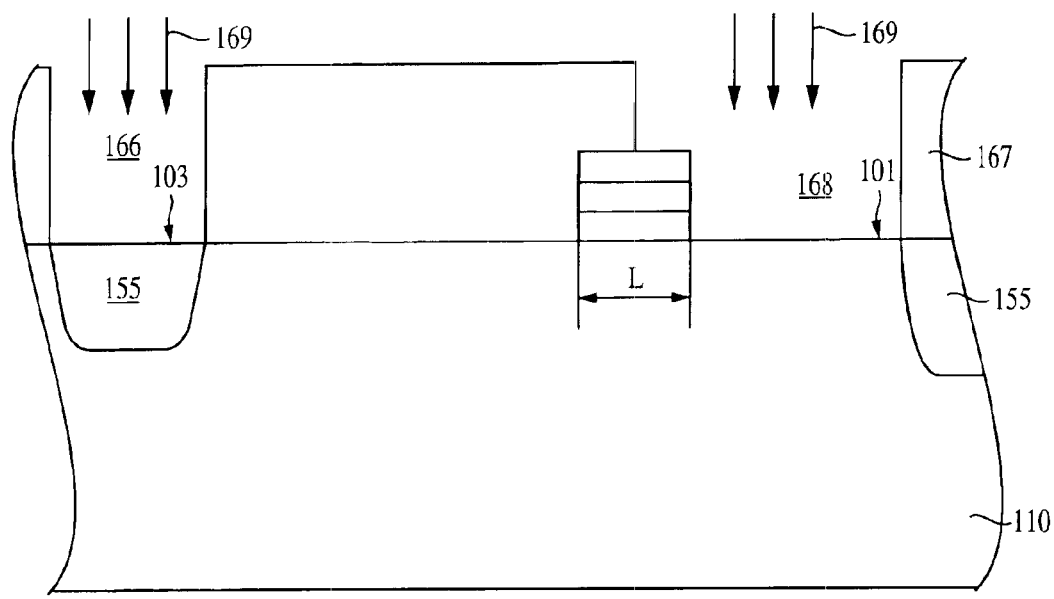
FIG. 5 is a schematic cross-sectional view of a CMOS image sensor pixel of FIG. 3 at a stage of processing subsequent to that shown in FIG. 4.

Referring now to FIG. 4, subsequent to the formation of the isolation regions 155 and of the gate stack 130, a first photoresist layer 167 is formed over the structure of FIG. 3 to a thickness of about 1,000 Angstroms to about 50,000 Angstroms, more preferably of about 10,000 Angstroms to about 45,000 Angstroms. The first photoresist layer 167 is patterned to obtain two openings: a first opening 168 over an area 101 (FIG. 4) of the substrate 110 where a well region will be formed below at least a portion of transfer gate stack 130; and a second opening 166 over the left isolation region 155 of FIG. 4, in accordance with an embodiment of the present invention.

As another example, the transistor immediate adjacent the photodiode in a 3T CMOS imager is the reset gate. Thus, in the case of 3T CMOS pixels, the first photoresist layer is patterned over the reset transistor. In general, the patterning occurs over the transistor adjacent to the photodiode.

As illustrated in FIG. 4, the first photoresist layer 167 is patterned so that, on one side of the first opening 168, the photoresist layer 167 extends over the gate stack 130 by a distance "$D_1$" of about 250 Angstroms to about 5,000 Angstroms, more preferably of about 1,000 Angstroms to about 4,000 Angstroms, which represents about half of the channel length L of the transfer gate 130. On the other side of the opening 168, the photoresist layer 167 is approximately coincident with the left side of right isolation region 155 of FIG. 5. Preferably, the opening 166 is smaller than the width W by about 0 to about 6,000 Angstroms, more preferably about 300 to about 3,000 Angstroms.

Figure 6:
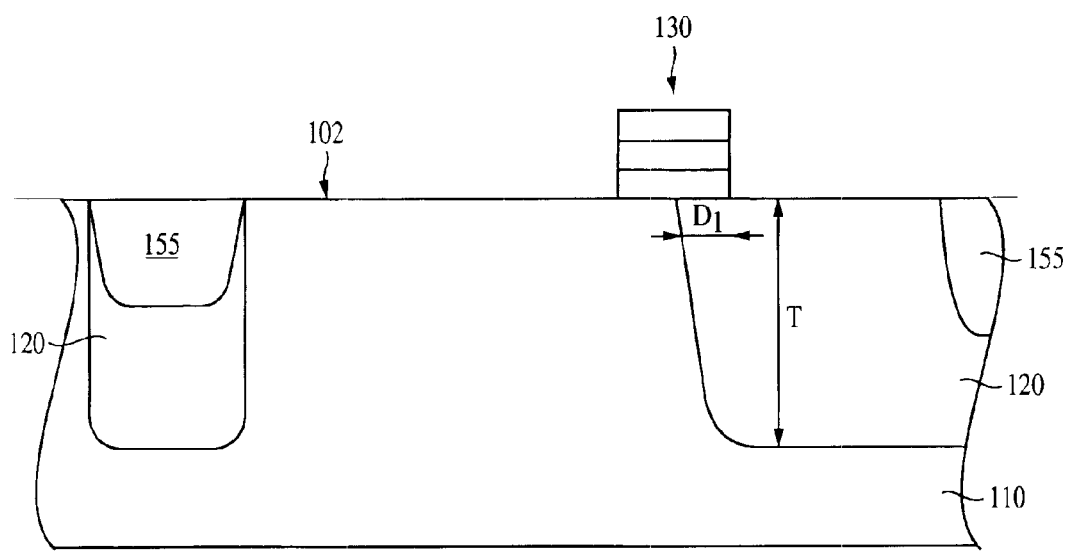
FIG. 6 is a schematic cross-sectional view of a CMOS image sensor pixel of FIG. 3 at a stage of processing subsequent to that shown in FIG. 5.

Next, the structure of FIG. 4 is subjected to a first dopant implantation 169 (FIG. 5) with a dopant of the first conductivity type, which for exemplary purposes is p-type. This way, p-type ions are implanted through openings 166, 168 and into areas 101, 103 of the substrate 110 to form a p-type well region 120, as illustrated in FIG. 6. The p-type well region 120 extends below about half the length L of the gate stack 130 and is adjacent an active area 102 (FIG. 6) of the substrate 110 where a photodiode is to be formed, as will be described below. The p-type well region 120 also extends below the left isolation region 155 of FIG. 6. The thickness T (FIG. 6) of the p-type well region 120, or the depth of the of the p-type well region 120 below the gate stack 130, is about 4,000 Angstroms to about 40,000 Angstroms, more preferably of about 10,000 Angstroms to about 30,000 Angstroms.

The dopant implantation 169 is conducted to implant p-type ions, such as boron or indium, into areas 101 and 103 of the substrate 110 located below about half the length L of the gate stack 130 and below the left isolation region 155, to form the p-type well region 120 (FIG. 6). The ion implantation 169 may be conducted at an energy of 50 keV to about 5 MeV, more preferably of about 100 keV to about 2 MeV. The implant dose in the p-type well 120 is within the range of about $5×10^{11}$ to about $5×10^{13}$ atoms per $cm^2$, and is preferably within the range of about $1×10^{12}$ to about $5×10^{12}$ atoms per $cm^2$. If desired, multiple implants may be used to tailor the profile of the p-type well region 120.

Figure 7:
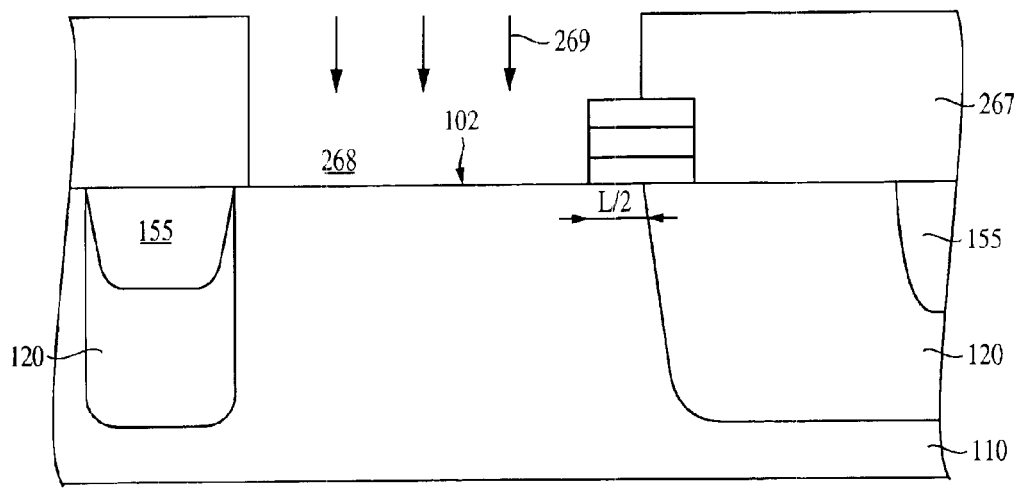
FIG. 7 is a schematic cross-sectional view of a CMOS image sensor pixel of FIG. 3 at a stage of processing subsequent to that shown in FIG. 6.
Figure 8:
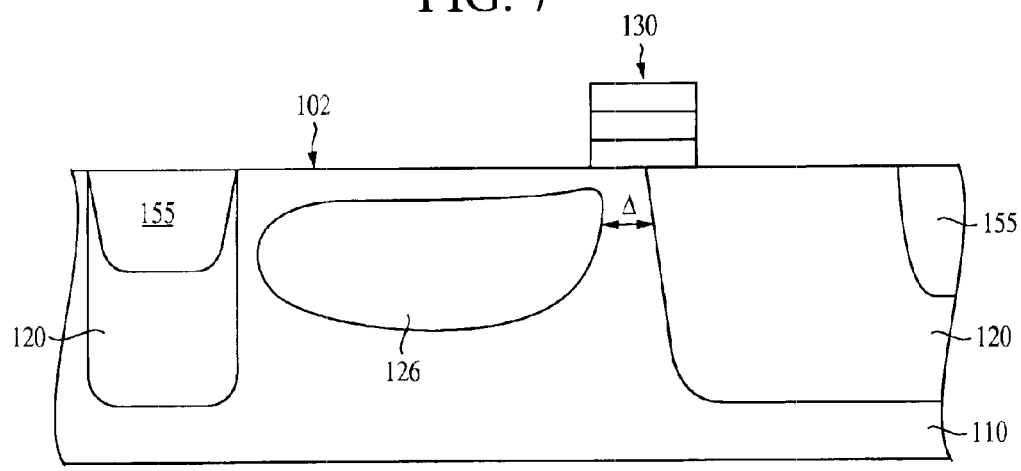
FIG. 8 is a schematic cross-sectional view of a CMOS image sensor pixel of FIG. 3 at a stage of processing subsequent to that shown in FIG. 7.

Subsequent to, or before, the formation of the p-type well region 120 shown in FIG. 6, a second masked dopant implantation is conducted with a dopant of a second conductivity type, which for exemplary purposes is n-type, to implant ions in the area of the substrate directly beneath the active area 102 of the pixel cell and to form an n-type region 126, as illustrated in FIG. 8. For this, a second photoresist layer 267 is formed over the structure of FIG. 6 and patterned to obtain a third opening 268, as shown in FIG. 7. On one side of the opening 268, the second photoresist layer 267 is spaced away from the edge of the left STI region 155 of FIG. 7. On the other side of the opening 268, the second photoresist layer 267 just overlaps the left lateral edge of the gate stack 130.

The implanted n-doped region 126 forms a photosensitive charge storage region for collecting photogenerated electrons which, on its right side, is laterally displaced from the p-type well 120 by an offset distance "Δ" (FIG. 8) of about 200 Angstroms to about 5,000 Angstroms, more preferably about 1,000 Angstroms to about 3,000 Angstroms, which represents just less than half of the channel length L of the transfer gate 130 (for a transfer gate channel of about 250 Angstroms to about 10,000 Angstroms, as noted above).

Ion implantation may be conducted by placing the substrate 110 in an ion implanter, and implanting appropriate n-type dopant ions into the substrate 110 at an energy of 10 keV to 1 MeV, more preferably 40 keV to 300 keV, to form the n-doped region 126. N-type dopants such as arsenic, antimony, or phosphorous may be employed. The implant dose of the n-doped region 126 (FIG. 8) is within the range of about $5×10^{11}$ to about $1×10^{13}$ atoms per $cm^2$, and is preferably within the range of about 1×10$^{12}$ to about 5×10$^{12}$ atoms per cm$^2$. If desired, multiple implants may be used to tailor the profile of the n-doped region 126. The implants forming region 126 may also be angled implants formed by angling the direction of implants 269 toward the gate stack 130.

Subsequent to the second dopant implantation 269 (FIG. 7), the second photoresist layer 267 is removed by conventional techniques, such as oxygen plasma for example. The structure at this point is depicted in FIG. 8.

Figure 9:
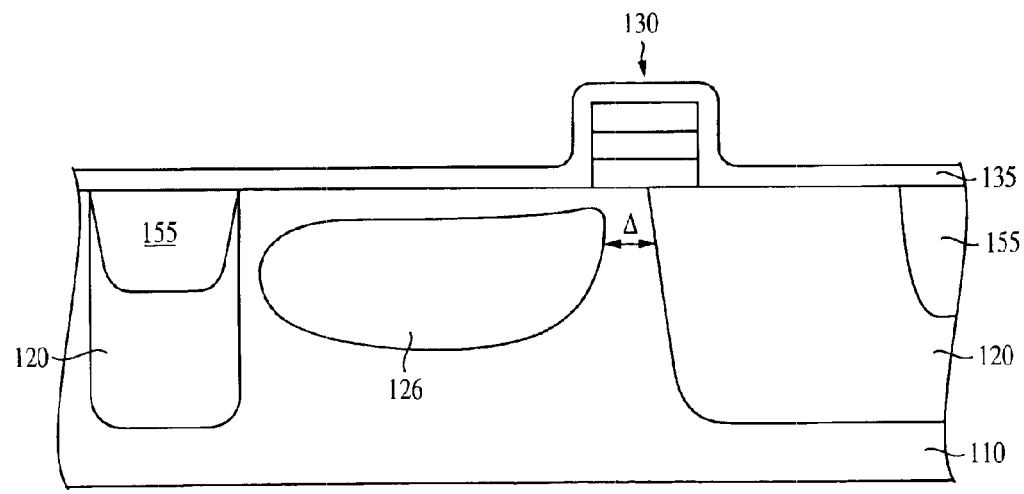
FIG. 9 is a schematic cross-sectional view of a CMOS image sensor pixel of FIG. 3 at a stage of processing subsequent to that shown in FIG. 8.

An insulating layer 135 is next formed over the substrate 110 including the p-type well region 120, the STI regions 155, and the gate stack 130, as shown in FIG. 9. The insulating layer 135 may be preferably an oxide, such as silicon dioxide, silicon nitride, silicon oxynitride, ON, NO, ONO or TEOS, among others. The insulating layer 135 may be formed by an oxidation or a deposition method and to a thickness of about 20 Angstroms to about 1,500 Angstroms, more preferably of about 30 Angstroms to about 1,000 Angstroms.

Figure 10:
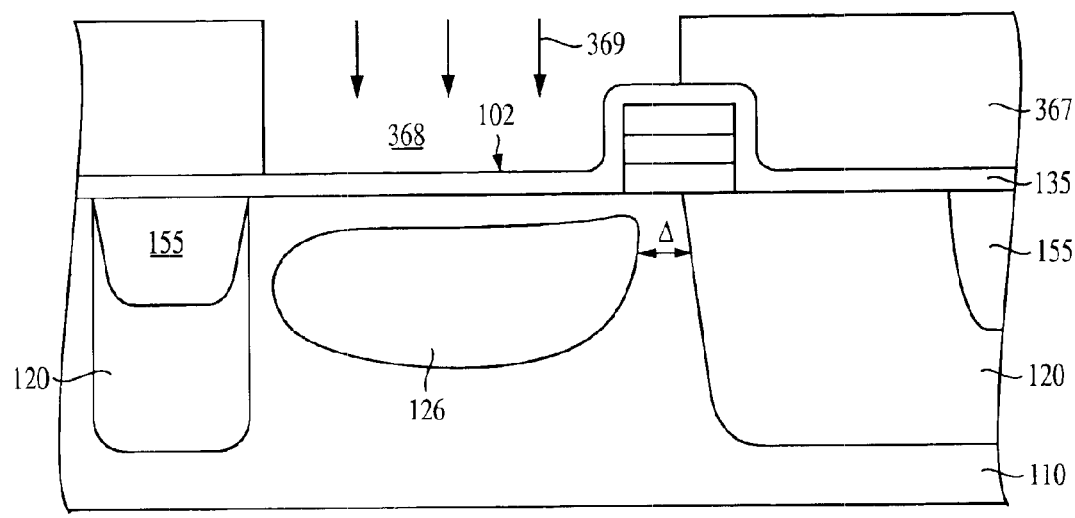
FIG. 10 is a schematic cross-sectional view of a CMOS image sensor pixel of FIG. 3 at a stage of processing subsequent to that shown in FIG. 9.

Next, a third photoresist layer 367 is formed over the structure of FIG. 9 and patterned to obtain a fourth opening 368, as shown in FIG. 10. On one side of the opening 368, the third photoresist layer 367 overlaps the left edge of the left STI region 155 of FIG. 10. On the other side of the opening 368, the third photoresist layer 367 overlaps the gate stack 130.

A third dopant implantation with a dopant of the first conductivity type, which for exemplary purposes is p-type, is conducted so that p-type ions are implanted into the area 102 of the substrate over the implanted n-type region 126 and between the transfer gate 130 and the isolation region 155, to form a p-type surface layer 124 of the now completed photodiode 199 (FIG. 11) formed by regions 124, 110 and 126. N-type floating diffusion region 125 (FIG. 11) may be formed within the p-type well 120 before or after the formation of the structures of the photodiode 199 by methods known in the art.

Figure 11:
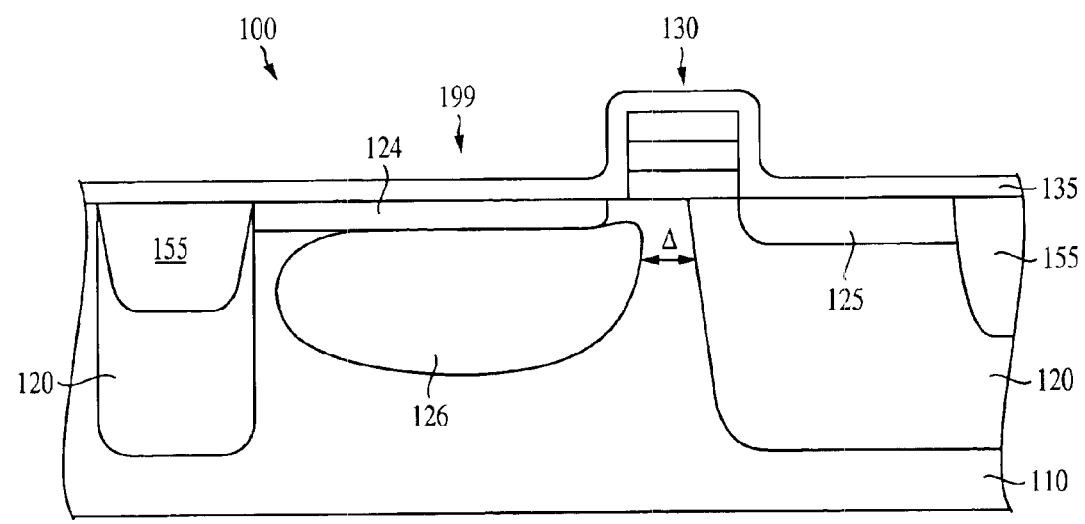
FIG. 11 is a schematic cross-sectional view of a CMOS image sensor pixel of FIG. 3 at a stage of processing subsequent to that shown in FIG. 10.
Figure 12:
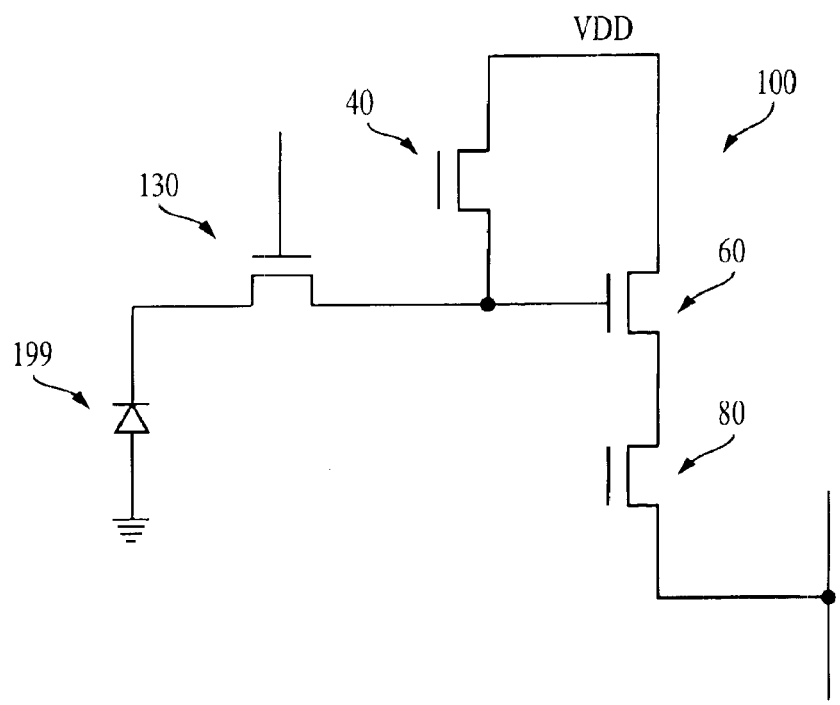
FIG. 12 is a schematic diagram of the image sensor pixel of FIG. 11.

After or during the formation of the trench isolation regions 155, p-type well 120 and photodiode regions shown in the embodiments of FIG. 11, the remaining devices of the pixel sensor cell 100 including the reset transistor, the source follower transistor and row select transistor shown in FIG. 1 as associated with respective gates 40, 60 and 80 and source/drain regions on either sides of the gates, are formed by well-known methods. FIG. 12 illustrates a schematic diagram of the pixel sensor cell 100 of FIG. 11. Conventional processing steps may be also employed to form contacts and wiring to connect gate lines and other connections in the pixel cell 100. For example, the entire surface may be covered with a passivation layer of, e.g., silicon dioxide, BSG, PSG, or BPSG, which is CMP planarized and etched to provide conductor holes, which are then metallized to provide contacts to the reset gate, transfer gate and other pixel gate structures, as needed. Conventional multiple layers of conductors and insulators to other circuit structures may also be used to interconnect the structures of the pixel sensor cell.

Although the invention has been described above with reference to a transfer gate of a transfer transistor for use in a four-transistor (4T) pixel cell of a CMOS imager, the invention also applies to CCD imagers.

Figure 13:
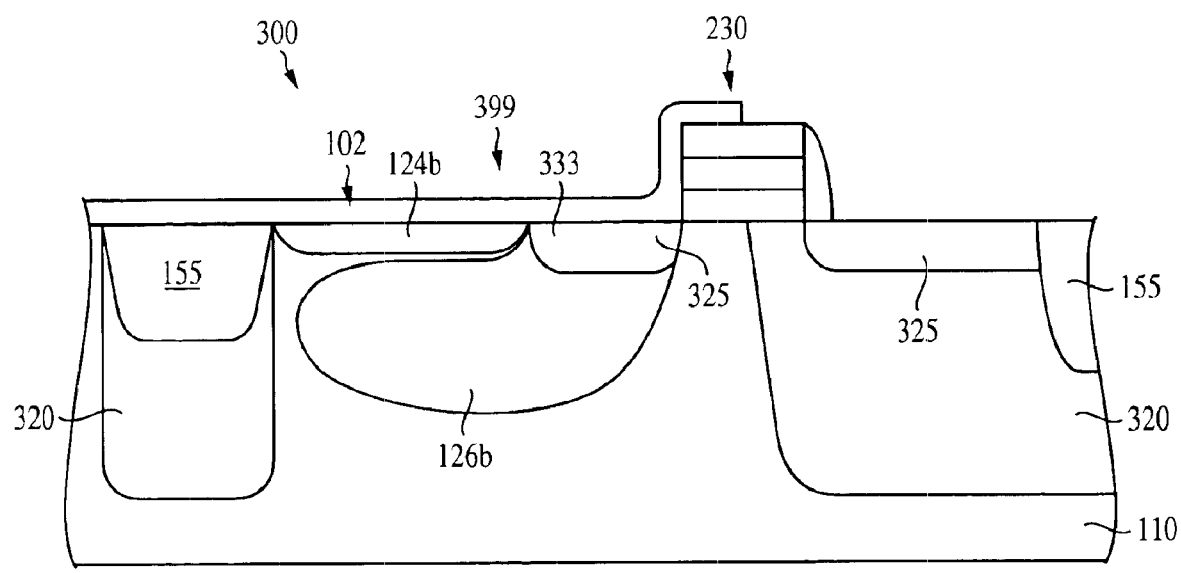
FIG. 13 is a schematic cross-sectional view of a CMOS image sensor pixel of FIG. 3 at a stage of processing subsequent to that shown in FIG. 4 and in accordance with a second embodiment of the invention.
Figure 14:
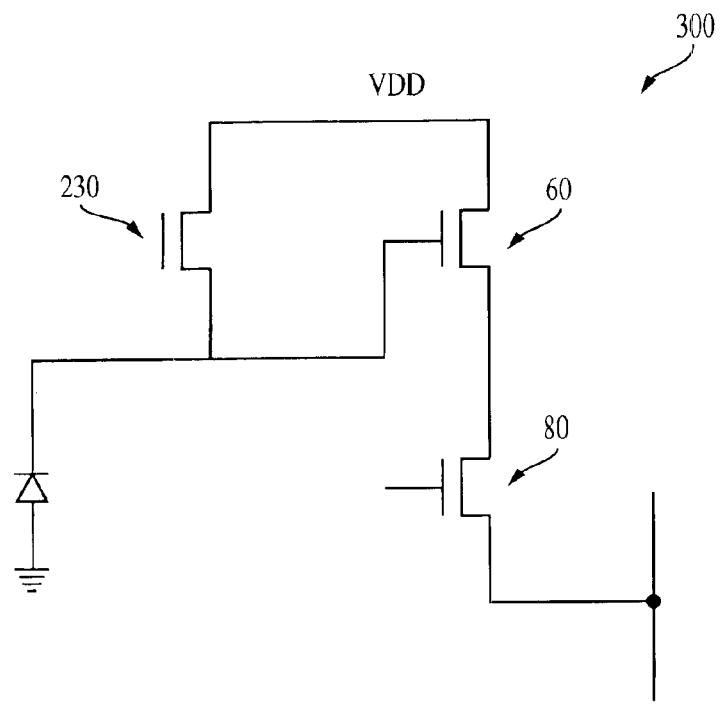
FIG. 14 is a schematic diagram of the image sensor pixel of FIG. 13.

In addition, although the invention has been described above with reference to a transfer gate of a transfer transistor for use in a four-transistor (4T) pixel cell, the invention also has applicability to a three-transistor (3T) cell or a five-transistor (5T) cell. For example, FIGS. 13–14 illustrate a 3T pixel sensor cell 300 comprising a p-type well region 320 formed below about half the length of reset gate stack 230 of a reset transistor. As known in the art, the 3T pixel sensor cell 300 differs from the 4T cell 100 by the omission of the charge transfer transistor and associated gate 130. The n-region 126b of photodiode 399 and the Vdd diffusion region 325 are coupled through the reset transistor 230. The p-type well region 320 is adjacent an active area 102 (FIG. 13) of the substrate 110 where photodiode 399 is formed. The p-type well region 320 also extends below the drain region 325 formed adjacent the reset gate stack 230 and below both isolation regions 155, as shown in FIG. 13. Region 325 is a more highly doped region to enable low contact resistance between the photodiode n-type region 126b to the source follower gate 60 through a contact to the 325 diffusion (not shown).

Figure 15:
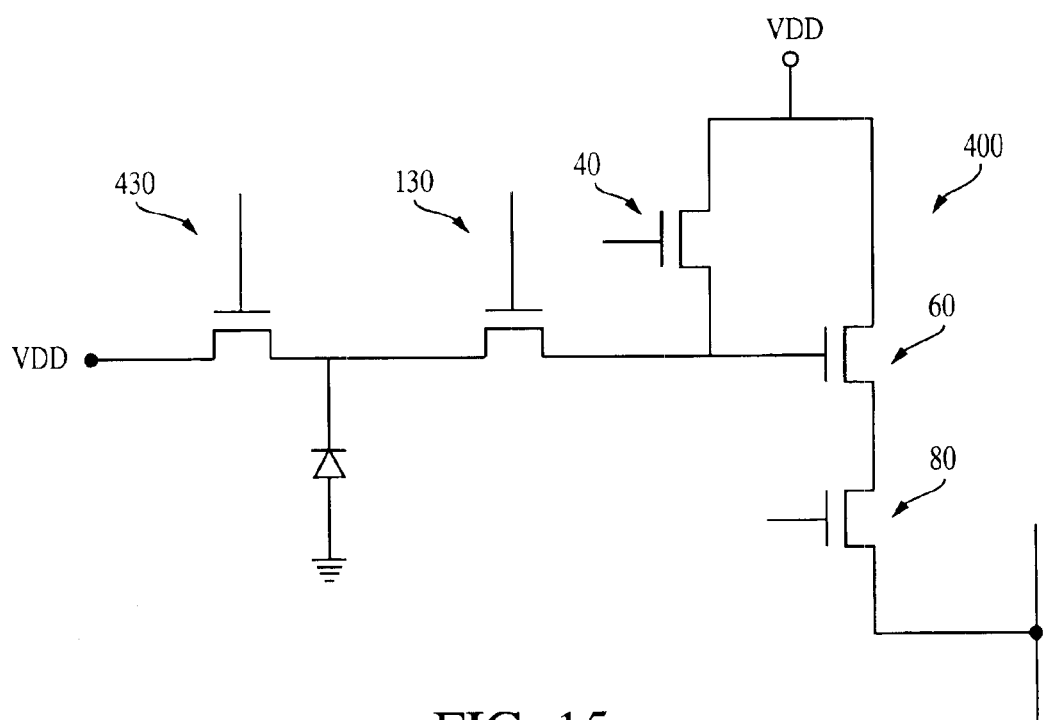
FIG. 15 is a schematic diagram of a 5T pixel sensor cell according to an embodiment of the present invention.

FIG. 15 illustrates a five-transistor (5T) cell 400 comprising a p-type well region formed below at least a portion of a transfer transistor 130, in accordance with another embodiment of the present invention. The 5T cell 400 differs from the 4T cell 100 of FIGS. 11–12 by the addition of a shutter transistor 430 (FIG. 15).

Figure 16:
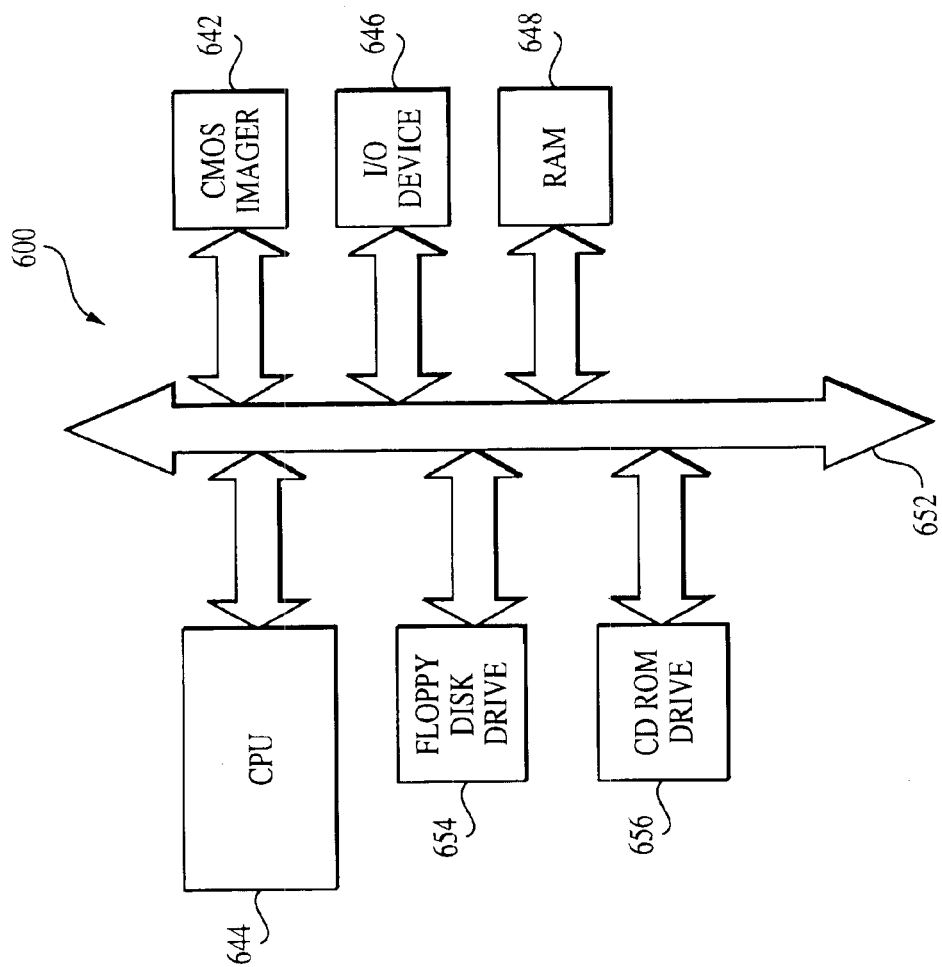
FIG. 16 illustrates a schematic diagram of a computer processor system incorporating a CMOS image sensor pixel fabricated according to the present invention.

An imager device 640 containing a pixel array having pixels as constructed above may be coupled to a processor system. A typical processor system, which includes a CMOS image sensor 642 according to the invention is illustrated in FIG. 16. Without being limiting, such a system could include a computer system, camera system, scanner, machine vision, vehicle navigation, video phone, and surveillance system, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

Although the embodiments of the invention have been described with reference to the formation of a p-n-p photodiode, such as the p-n-p photodiode 199, 399 (FIGS. 11 and 13) and a p-type well region 120, 320 formed below at least a portion of an active region of a transistor gate stack, it must be understood that the invention is not limited to this embodiment. Accordingly, the invention has equal applicability to complementary structures employing n-p-n photodiodes and an n-type well region 120, 320 formed by the above-described methods. Of course, the dopant and conductivity type of all structures will change accordingly, with the transfer gate corresponding to a PMOS transistor.

Further, although the embodiments of the invention have been described with reference to the formation of the p-type well region 120, 320 formed subsequent to the formation of gate stack 130, 230 the invention also contemplates the formation of the p-type well region 120, 320 prior to the formation of the gate stack 130, 230.

The above description and drawings are only to be considered illustrative of exemplary embodiments, which achieve the features and advantages of the invention. Modification and substitutions to specific process conditions and

What is claimed as new and desired to be protected by Letters Patent of the United States is:

1. A method of processing an implanted region, comprising:
   forming at least one transistor gate over a substrate of a first conductivity type;
   forming an implanted well region of said first conductivity type below at least a portion of said transistor gate, said implanted well region is formed to a thickness of about 4,000 to about 40,000 Angstroms; and
   providing an electrical device laterally displaced from said implanted region.

2. The method of claim 1, wherein said implanted well region is formed below about half the channel length of said transistor gate.

3. The method of claim 1, wherein said implanted well region is formed by conducting an implant with dopants of said first conductivity type in an area of said substrate below half the channel length of said transistor gate.

4. The method of claim 1, wherein said implanted well region has an implant dose of about $5\times10^{11}$ to about $5\times10^{13}$ atoms per $cm^2$.

5. The method of claim 1, wherein said electrical device is an imager.

6. The method of claim 5, wherein said electrical device is a CMOS imager.

7. The method of claim 5, wherein said electrical device is a CCD imager.

8. The method of claim 5, wherein said electrical device is a photosensor, a photodiode, a photoconductor or a photogate.

9. A method of forming a photodiode for a pixel sensor cell, comprising:
   forming at least one isolation region in a substrate;
   forming a gate stack over said substrate;
   forming an implanted well region of a first conductivity type in said substrate and adjacent at least a portion of said isolation region and of said gate stack;
   forming a doped region of a second conductivity type in said substrate and laterally displaced from said implanted well region; and
   forming a doped layer of said first conductivity type in said substrate, said doped layer being in contact with said doped region of said second conductivity type.

10. The method of claim 9, wherein said implanted well region is formed below at least a portion of said isolation region.

11. The method of claim 9, wherein said implanted well region is formed below about half the channel length of said gate stack.

12. The method of claim 9, wherein said doped region of said second conductivity type is laterally displaced from said implanted well region by about 1,000 Angstroms to about 5,000 Angstroms.

13. The method of claim 12, wherein said doped region of said second conductivity type is laterally displaced from said implanted well region by about 1,000 Angstroms to about 3,000 Angstroms.

14. The method of claim 9, wherein said implanted well region is implanted with a p-type dopant and an implant dose of about $5\times10^{11}$ to about $5\times10^{13}$ atoms per $cm^2$.

15. The method of claim 9, wherein said implanted well region is formed to a thickness of about 4,000 to about 40,000 Angstroms.

16. The method of claim 9, wherein said implanted well region is formed subsequent to the formation of said gate stack.

17. The method of claim 9, wherein said implanted well region is formed prior to the formation of said gate stack.

18. The method of claim 9, wherein said gate stack is part of a transfer transistor.

19. The method of claim 9, wherein said gate stack is part of a reset transistor.

20. The method of claim 9, wherein said photodiode is a p-n photodiode or an n-p photodiode.

21. The method of claim 9, wherein said photodiode is part of a CCD sensor.

22. The method of claim 9, wherein said photodiode is part of a CMOS sensor.

23. A method of forming a p-n photodiode for a CMOS imaging device, said method comprising:
   forming at least one trench isolation region in a silicon substrate;
   forming a gate stack of a transistor over said silicon substrate; and
   forming a doped well region below about half the channel length of said gate stack and below said trench isolation region by implanting p-type ions in said silicon substrate, said doped region having an implant dose of about $5\times10^{11}$ to about $5\times10^{13}$ atoms per $cm^2$.

24. The method of claim 23 further comprising the steps of:
   forming an n-type doped region in said silicon substrate; and
   forming a p-type doped layer in said silicon substrate and above said n-type doped region, said p-type doped layer and said n-type doped region being laterally displaced from said doped well region.

25. The method of claim 24, wherein said n-type doped region is laterally displaced from said doped well region by about half the channel length of said gate stack.

26. The method of claim 23, wherein said doped well region is formed below about half the channel length of said gate stack.

27. The method of claim 23, wherein said doped well region is formed to a thickness of about 4,000 to about 40,000 Angstroms.

* * * * *